United States Patent
Nguyen et al.

(10) Patent No.: US 11,579,165 B2
(45) Date of Patent: Feb. 14, 2023

(54) METHOD AND APPARATUS FOR IMPROVING MEMS ACCELEROMETER FREQUENCY RESPONSE

(71) Applicant: Analog Devices, Inc., Norwood, MA (US)

(72) Inventors: Khiem Quang Nguyen, Tewksbury, MA (US); Adam R. Spirer, Westwood, MA (US)

(73) Assignee: Analog Devices, Inc., Wilmington, MA (US)

( * ) Notice: Subject to any disclaimer, the term of this patent is extended or adjusted under 35 U.S.C. 154(b) by 37 days.

(21) Appl. No.: 16/751,182

(22) Filed: Jan. 23, 2020

(65) Prior Publication Data
US 2021/0231701 A1  Jul. 29, 2021

(51) Int. Cl.
*G01P 15/08* (2006.01)
*B81B 3/00* (2006.01)
*G01P 15/18* (2013.01)

(52) U.S. Cl.
CPC ............ *G01P 15/08* (2013.01); *B81B 3/0021* (2013.01); *G01P 15/18* (2013.01); *B81B 2201/0235* (2013.01)

(58) Field of Classification Search
CPC ........................................................ G01P 15/08
USPC ........................................................ 73/514.01
See application file for complete search history.

(56) References Cited

U.S. PATENT DOCUMENTS

| | | | |
|---|---|---|---|
| 5,400,269 A | * | 3/1995 | White .............. G01C 19/5607 73/504.12 |
| 7,899,196 B2 | | 3/2011 | Furst et al. |
| 7,936,887 B2 | | 5/2011 | Smyth |
| 8,705,597 B2 | | 4/2014 | Le Blanc et al. |
| 9,380,384 B2 | | 6/2016 | Fitzgerald |
| 9,577,663 B1 | | 2/2017 | Paton Alvarez et al. |
| 9,596,551 B2 | | 3/2017 | Pedersen et al. |
| 9,716,933 B2 | | 7/2017 | Oliaei |
| 9,936,304 B2 | | 4/2018 | Bach et al. |

(Continued)

FOREIGN PATENT DOCUMENTS

| | | |
|---|---|---|
| CN | 102447446 A | 5/2012 |
| EP | 3 026 930 A1 | 6/2016 |
| WO | 2018/159948 A1 | 9/2018 |

OTHER PUBLICATIONS

Jeong et al. "A study on resonant frequency and Q factor tunings for MEMS vibratory gyroscopes." Journal of micromechanics and microengineering 14.11 (2004): 1530. (Year: 2004).*

(Continued)

*Primary Examiner* — Walter L Lindsay, Jr.
*Assistant Examiner* — Philipmarcus T Fadul
(74) *Attorney, Agent, or Firm* — Wolf, Greenfield & Sacks, P.C.

(57) ABSTRACT

Sensor apparatus and methods for operating the same for measuring acceleration are disclosed. In some embodiments, circuitry inside a sensor digitizes a measured acceleration signal from an accelerometer into a digitized acceleration signal, which is processed by a digital equalization filter within the sensor to provide an equalized acceleration signal. The equalized acceleration signal may have a frequency response that is substantially flat over a frequency range that extends beyond the resonant frequency of a MEMs sensor within the accelerometer of the sensor.

16 Claims, 7 Drawing Sheets

(56) References Cited

U.S. PATENT DOCUMENTS

| | | | |
|---|---|---|---|
| 9,976,924 | B2 | 5/2018 | Straeussnigg et al. |
| 10,425,733 | B1 | 9/2019 | Choisel et al. |
| 2015/0043747 | A1 | 2/2015 | Barham |
| 2015/0149121 | A1* | 5/2015 | Ahmed .................. G01P 21/00 702/190 |
| 2016/0366518 | A1 | 12/2016 | Strogis et al. |
| 2019/0230446 | A1 | 7/2019 | Schultz |
| 2020/0023139 | A1* | 1/2020 | Streit .................. A61M 5/3158 |

OTHER PUBLICATIONS

Osborn. "Gyroscope angular rate processing across asynchronous clock domains." Diss. Massachusetts Institute of Technology, 2002. (Year: 2002).*

[No Author Listed], Analog Devices. ADIS16228 Data Sheet. Digital Triaxial Vibration Sensor with FFT Analysis and Storage Digital. 2011; 29 pages.

[No Author Listed], MEMS microphone mechanical & acoustical implementation. Infineon Application Note. AN557. Apr. 10, 2018; 20 pages.

[No Author Listed], ST life-augmented. AN4426 Application note. Tutorial for MEMS microphones. Feb. 2017; 20 pages.

Holm, Optimizing Microphone Arrays for use in Conference Halls. Master of Science in Electronics. Norwegian University of Science and Technology. Department of Electronics and Telecommunications. Jun. 2009; 106 pages.

Kiiski, Acoustic Multi-Microphone Beamforming in a Practical Form Factor. Thesis submitted for examination for the degree of Master of Science in Technology. Aalto University School of Electrical Engineering. Jan. 23, 2017; 89 pages.

Prato et al., Pressure calibration of a digital Mems microphone by comparison. The Journal of the Acoustical Society of America Express Letters. 2018; 22 pages.

Siljeholm et al., Increasing Sound Quality using Digital Signal Processing in a Surveillance System. Master's Thesis. Department of Electrical and Information Technology. Faculty of Engineering. Lund University. Jun. 7, 2016; 92 pages.

Extended European Search Report dated Jun. 23, 2021 in connection with European Application 21152623.1.

Klippel, The Mirror Filter—A New Basis for Reducing Nonlinear Distortion and Equalizing Response in Woofer Systems. Journal of the Audio Engineering Society, Audio Engineering Society. Sep. 30, 1992; 40 (9):675-691.

* cited by examiner

METHOD AND APPARATUS FOR IMPROVING MEMS ACCELEROMETER FREQUENCY RESPONSE The present application relates to digital processing of sensor signals.

BACKGROUND

Sensors operate by detecting a change in a sensed condition, and output electrical signals representing the sensed condition. The sensed condition may include acceleration, velocity, pressure, or other mechanical or environmental conditions. The output electrical signal is a time-domain signal that reflects how the sensed condition changes versus time. The output electrical signal can also be represented in the frequency domain in terms of magnitude and frequency. The magnitude of the output electrical signal can be influenced by characteristics of the processing circuitry that receives the sensor output. It is desirable, in many applications, to use the processing circuitry to enhance the frequency response of the sensor element. The enhancement is in the form of magnitude adjustment, so that the bandwidth of the sensor is widened.

SUMMARY OF THE DISCLOSURE

Sensor apparatus and methods for operating the same for measuring acceleration are disclosed. In some embodiments, circuitry inside a sensor apparatus digitizes a measured acceleration signal from an accelerometer into a digitized acceleration signal, which is processed by a digital equalization filter within the sensor to provide an equalized acceleration signal. The equalized acceleration signal may have a frequency response that is substantially flat over a frequency range that extends beyond the resonant frequency of a MEMs sensor within the accelerometer of the sensor apparatus.

In some embodiments, a method for operating a sensor apparatus is provided. The sensor apparatus comprises an accelerometer. The accelerometer has a microelectromechanical system (MEMs) sensor. The method comprises measuring an acceleration signal at an output of the accelerometer; generating a digitized acceleration signal based on the acceleration signal; and processing, with a digital equalization filter, the digitized acceleration signal to generate an equalized acceleration signal.

In some embodiments, a sensor apparatus is provided. The sensor apparatus comprises an accelerometer having a microelectromechanical system (MEMs) sensor; a non-volatile memory configured to store one or more coefficients representing one or more mechanical characteristics of the MEMs sensor; circuitry that is configured to measure an acceleration signal at an output of the accelerometer and to generate a digitized acceleration signal based on the acceleration signal. The sensor apparatus further comprises a digital equalization filter configured to generate an equalized acceleration signal based on the digitized acceleration signal.

In some embodiments, a sensor system is provided. The sensor system comprises an accelerometer having an output; and means for equalizing an acceleration signal at the output.

BRIEF DESCRIPTION OF THE DRAWINGS

Various aspects and embodiments of the application will be described with reference to the following figures. It should be appreciated that the figures are not necessarily drawn to scale. Items appearing in multiple figures are indicated by the same reference number in all the figures in which they appear. In the drawings.

DETAILED DESCRIPTION

Figure 1:
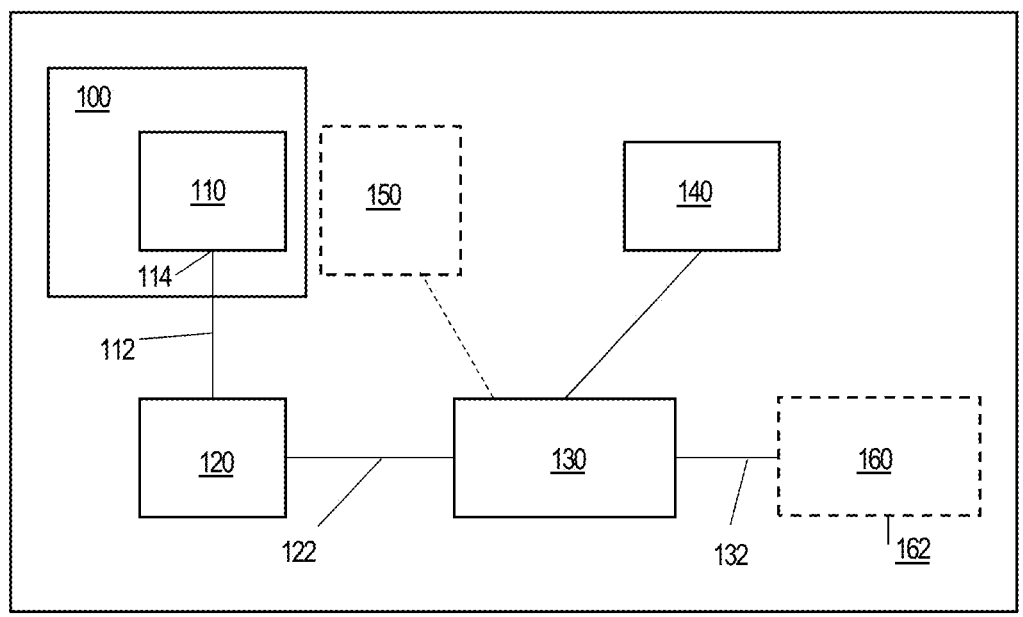
FIG. 1 is a high-level block diagram of a sensor apparatus, according to some embodiments.

Aspects of the present application are directed to a sensor apparatus for measuring an acceleration of the sensor. The inventor has appreciated and recognized that in certain applications, such as detecting acoustic vibrations related to speech, it is desirable for the frequency response of the measured acceleration to be substantially flat over a wide range of frequencies. The inventor has also recognized that in a sensor based on a MEMs accelerator having a MEMs sensor, the flatness of the frequency response of the measured acceleration is often dictated by the measurement bandwidth of the MEMs accelerator, which in itself is affected by the resonant behavior of the MEMs sensor such as its resonant frequency $f_0$ and quality factor Q.

As an example of a measurement bandwidth of a MEMs accelerator, it may only have a relatively flat frequency response from very low frequency of close to direct current (DC), to approximately $f_0/3$. While choosing a MEMs sensor having a greater $f_0$ may increase the measurement bandwidth, doing so has other undesirable consequences. For example, a higher $f_0$ will increase noise at the accelerator output, because noise is proportional to the square of $f_0$. Therefore, it is desirable to keep $f_o$ at a relatively low frequency for a low noise accelerator. However, with a low frequency $f_0$, the frequency response tends to peak up rapidly beyond the measurement band towards the resonance peak due to the Q factor. Therefore the inventor has recognized a need to extend the measurement bandwidth and improve the flatness of the frequency response of a low noise accelerometer, preferably in a frequency range beyond the resonance peak at $f_0$. Aspects of the present application are directed to a solution to such a need.

In some embodiments, circuitry inside a sensor apparatus digitizes a measured acceleration signal from an accelerometer into a digitized acceleration signal, which is processed by a digital equalization filter within the sensor to provide an equalized acceleration signal. The equalized acceleration signal may have a frequency response that is substantially flat over a frequency range that extends beyond the $f_0$ of a MEMs sensor within the accelerometer of the sensor apparatus.

The inventor has recognized and appreciated that while it is possible to perform equalization of an analog output signal of the accelerometer, such analog equalization has several drawbacks compared to the digital equalization as disclosed herein. For example, accelerometer components are prone to have variations in parametric values, due to the manufacturing process and environmental stress during operation. Analog equalization using analog circuitry suffers from component parameter drift due to process, supply and temperature variation, thus cannot maintain an accurate equalization at all time. Furthermore, analog circuitry often include discreet passive components such as capacitors and inductors that may be more complex and costly to manufacture compared to digital circuitry that can be implemented as integrated circuit on a semiconductor die.

According to an aspect of the present application, digital equalization is performed on an digitized acceleration signal, rather than a velocity, displacement, or sound power in the case of acoustic vibrations. The inventor has appreciated and recognized that velocity and displacement may be derived from acceleration signals by performing one or more levels of integrations. Because the un-equalized MEMs sensor has a significant boost in frequency response at $f_0$, noise picked up by the accelerometer will be amplified in the accelerometer output around $f_0$. By equalizing the acceleration signal to have a flat frequency response prior to integration, the effect of noise boost around the resonant peak may be reduced in subsequent processing stages, which result in a low-noise sensor output across a broad measurement bandwidth.

In some embodiments, the digital equalization filter may utilize a transfer function of the MEMs sensor to equalize the digital acceleration signal. The transfer function may be represented by a formula based on $f_0$ and Q of the MEMs sensor, and coefficients of the formula may be stored in a non-volatile memory of the sensor apparatus for use by the digital equalization filter during operation of the sensor. Each MEMs sensor may be characterized, for example with a tester, to obtain its $f_0$ and Q during manufacturing process.

In some embodiments, the digital equalization filter may be used in conjunction with a temperature sensor located adjacent the accelerometer. In such embodiments, a predictive model of the accelerometer response variation versus temperature may be used by the digital equalization filter to perform corrective processing of the digital acceleration signal to reduce or eliminate the temperature dependence of the MEMs sensor output.

In some embodiments, digital equalization may be performed by first obtaining an inverse transfer function of the MEMs sensor by a group of cascaded digital filters. The digitized acceleration signal outputted by the MEMs accelerometer can then be convolved with the impulse responses of the cascaded digital filters to obtain an equalized acceleration signal with a flat frequency response so that the effective measurement bandwidth can be extended beyond the resonant frequency $f_0$.

FIG. 1 is a high level block diagram of a sensor apparatus 10, according to some embodiments. Sensor apparatus 10 comprises an accelerometer 100 having a MEMs sensor 110, circuitry 120, a digital equalization filter 130, a non-volatile memory 140, and optionally a temperature sensor 150. Sensor apparatus 10 also may optionally comprise one or more integrators 160. Accelerometer 100 may also be referred to as a MEMs accelerometer.

In FIG. 1, MEMs sensor 110 may be a mechanical sensor fabricated using MEMs technology known in the art. MEMs sensor 110 may comprise one or more proof masses that are movably attached to a support substrate, allowing the proof masses to move in response to external electric and/or mechanical stimuli. MEMs sensor 110 may be of any suitable geometry, material, and transduction mechanism, as aspects of the present application are not so limited. In one non-limiting example, MEMs sensor 110 is part of a low noise, low-g accelerometer that has a $f_0$ of a few kHz.

Accelerator 100 may comprise a number of active and passive electronic components to provide power and control signals to MEMs sensor 110, and to collect electrical signals in response to motion. In some embodiments, MEMs sensor 110 is a quasi-static mechanical resonator that has high dissipation and low Q, and operates as a very lossy resonator, although aspects of the present application is not so limited. In some other embodiments, MEMs sensor 110 may be a high-Q resonator driven by a driving signal to resonate at a resonant frequency $f_0$. In response to an acceleration, accelerator 100 may generate an acceleration signal 112 at an accelerator output 114. Acceleration signal 112 may have an amplitude that varies both in time domain and in frequency domain based on the a mechanical acceleration α of the MEMs accelerator 100. The mechanical acceleration may be a linear acceleration of the sensor 10 along any linear axis, or an angular acceleration along any axis.

Mechanical acceleration α may have different frequency components α(ω), where ω is the frequency. Without wishing to be bound by a particular theory, accelerator 100 may have a resonance response curve characterized by a transfer function H(ω):

$$H(\omega)=\omega_0\omega/\omega^2+\omega_0/Q\omega+\omega_0^2 \qquad \text{(Eq. 1)},$$

where $\omega_0=2\pi f_0$ is the resonant angular frequency of the MEMs sensor 110, and Q is its quality factor. $f_0$ and Q are characteristic mechanical properties of the MEMs sensor 110, and may be characterized using methods known to a person of ordinary skill in the art on the accelerator 100. Acceleration signal 112 is proportional to H(ω)·α(ω), and has a relatively flat frequency response at a low frequency range, where the transfer function H(ω) does not vary significantly over ω. In such a low frequency range, the accelerometer may be considered a good linear transducer of mechanical acceleration, and the frequency range may be considered a usable range. When ω increases to approach resonance however, H(ω) peaks up rapidly and acceleration signal 112 may no longer be a good representation of the mechanical acceleration. An example of the frequency response in acceleration signal 112 is illustrated in FIG. 2.

Figure 2:
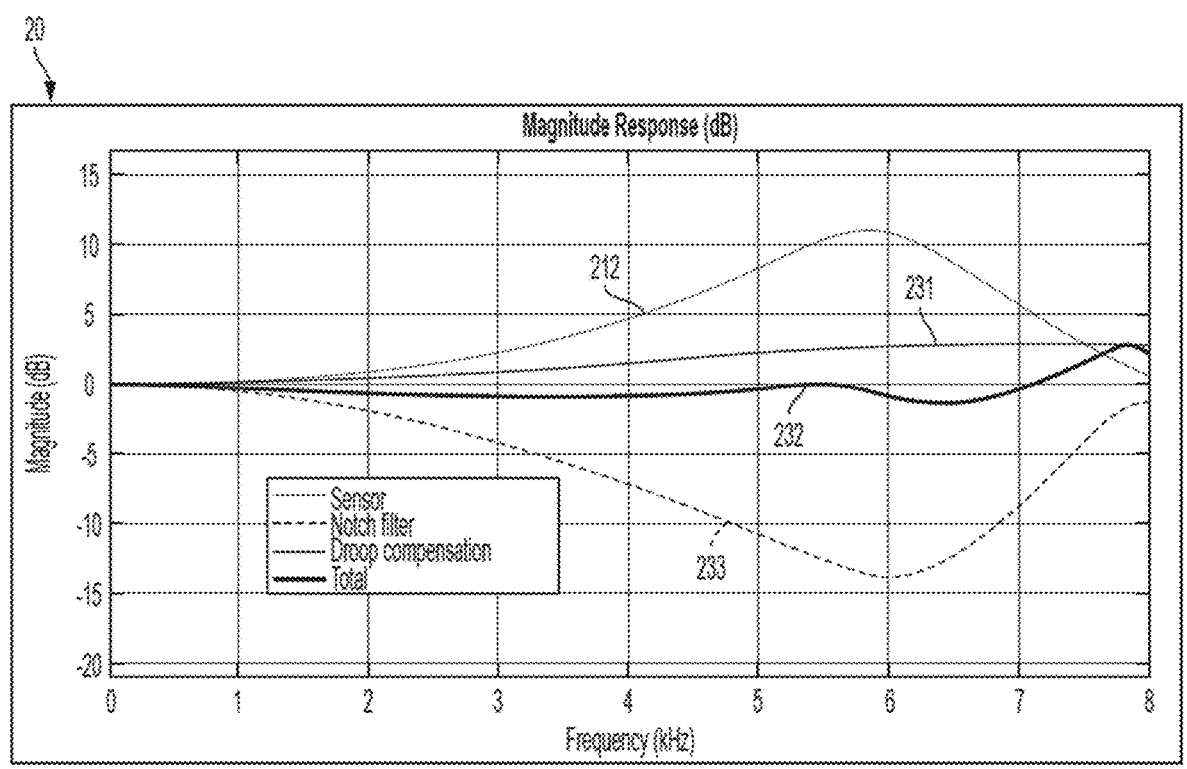
FIG. 2 is a simulated data chart illustrating frequency response curves of several exemplary sensors, in accordance with some embodiments.

FIG. 2 is a simulated data chart 20 illustrating frequency response curves of several exemplary sensors, in accordance with some embodiments. Curve 212 is a simulated magnitude (measured in unit of decibel or dB) versus frequency curve that may be a frequency response of an acceleration signal such as signal 112 in FIG. 1. To simulate curve 212, a MEMs sensor having $f_0$=5.8 kHz and Q=3.5 is used, which is typical for a low-noise, low-g resonator.

As shown in FIG. 2, curve 212 is relatively flat with a magnitude variation of no more than 1 dB in the frequency range of between zero to about 1.5 kHz, and relatively flat with a magnitude variation of no more than 3 dB in the frequency range of between zero to about 3 kHz. Above 3 kHz, the frequency response increases quickly to peak at more than 10 dB approaching $f_0$ due to the shape of the resonance transfer function. Therefore for the resonator in this example, the usable frequency range is only 1.5 kHz if a flatness of no more than 1 dB is desired, or only 3 kHz if a flatness of no more than 3 dB is desired.

Aspects of the present application is directed to a digital equalization technique that may provide a usable frequency response range from DC to beyond $f_0$, or beyond 5.8 kHz in the example of curve 212 as shown in FIG. 2.

Referring back to the embodiment shown in FIG. 1, circuitry 120 measures the analog acceleration signal 112 at the accelerator output 114, and generates a digitized acceleration signal 122 that represents the acceleration signal 112. Circuitry 120 may include an analog-to-digital converter (ADC) of a type that is known in the art.

Figure 3:
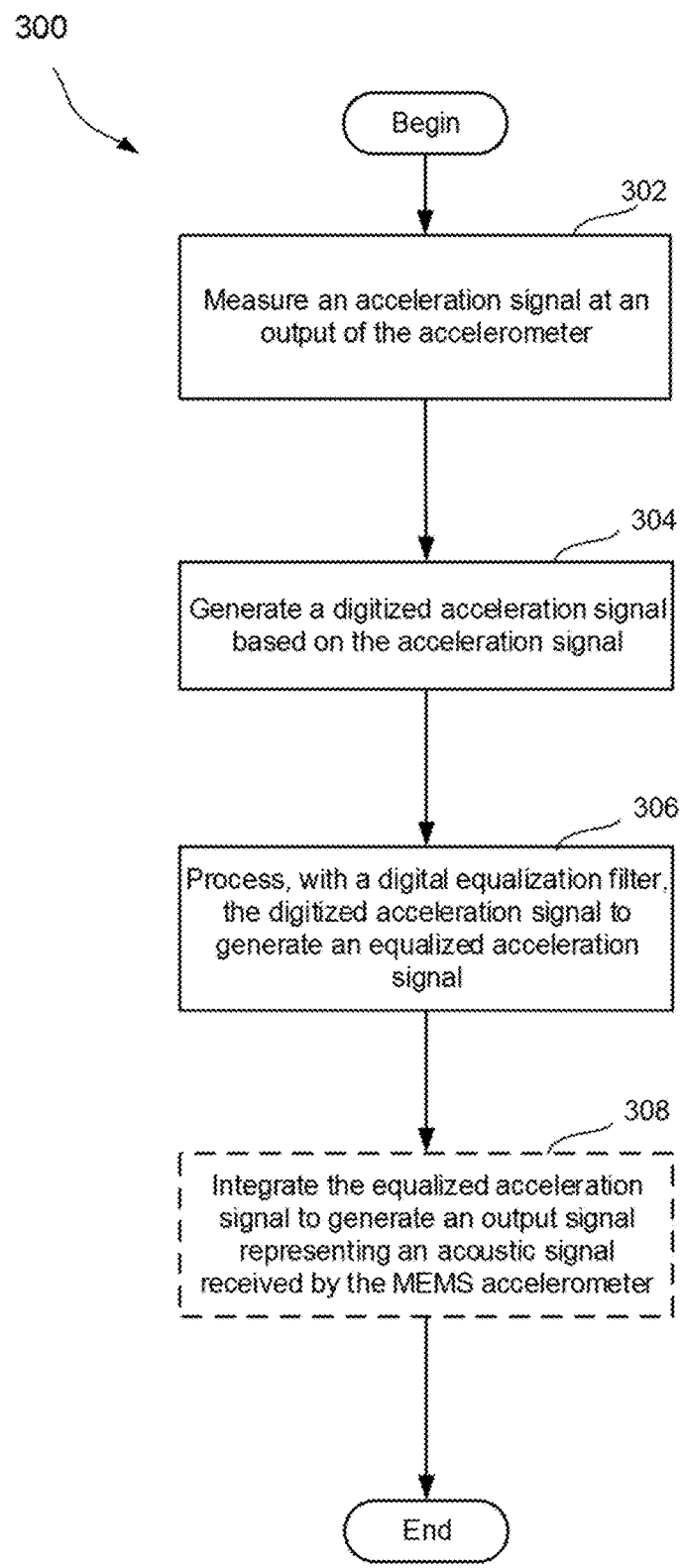
FIG. 3 is a flow diagram of an exemplary process for performing digital equalization, in accordance with some embodiments.

Still referring to FIG. 1, digital equalization filter 130 receives the digitized acceleration signal 122 from circuitry 120, and generates an equalized acceleration signal that is based on the digitized acceleration signal 122, but has an expanded usable frequency range having a desired flat frequency response throughout. The inventor has recognized and appreciated that FIG. 3 is a flow diagram of an exemplary process 300 for performing digital equalization, in accordance with some embodiments. At act 302 of process 300, circuitry 120 measures acceleration signal 112 at output 114 of accelerometer 100. At act 304, circuitry 120 generates digitized acceleration signal 122 based on acceleration signal 112. At act 306, digital equalization filter 130 processes the digitized acceleration signal 122 to generate an equalized acceleration signal 132, which may be provided as an output of sensor 10.

Optionally and as shown in FIG. 1, sensor 10 comprises one or more integrator 160. As shown in FIG. 3, at act 308, integrator 160 integrates the equalized acceleration signal 132 and generates an output signal 162 based on a time integral of equalized acceleration signal 132. In some embodiments, equalized acceleration signal 132 is integrated once to represent a velocity signal. In some embodiments, equalized acceleration signal 132 is integrated twice to represent a displacement signal. In one non-limiting example, sensor 10 is configured to sense an acoustic signal such as a human utterance or music. In such an example, an equalized acceleration signal is integrated twice to obtain a displacement signal across a usable frequency range that spans to 10 kHz or above. The integrated acceleration signal may be representative of a sound pressure, or sound power of the acoustic signal.

The inventor has recognized and appreciated that if the transfer function of the MEMs sensor is predetermined, the transfer function can be used in the digital equalization filter to process the sensed signal to suppress the resonator's peaking behavior around $f_0$ in the digital domain.

Figure 4:
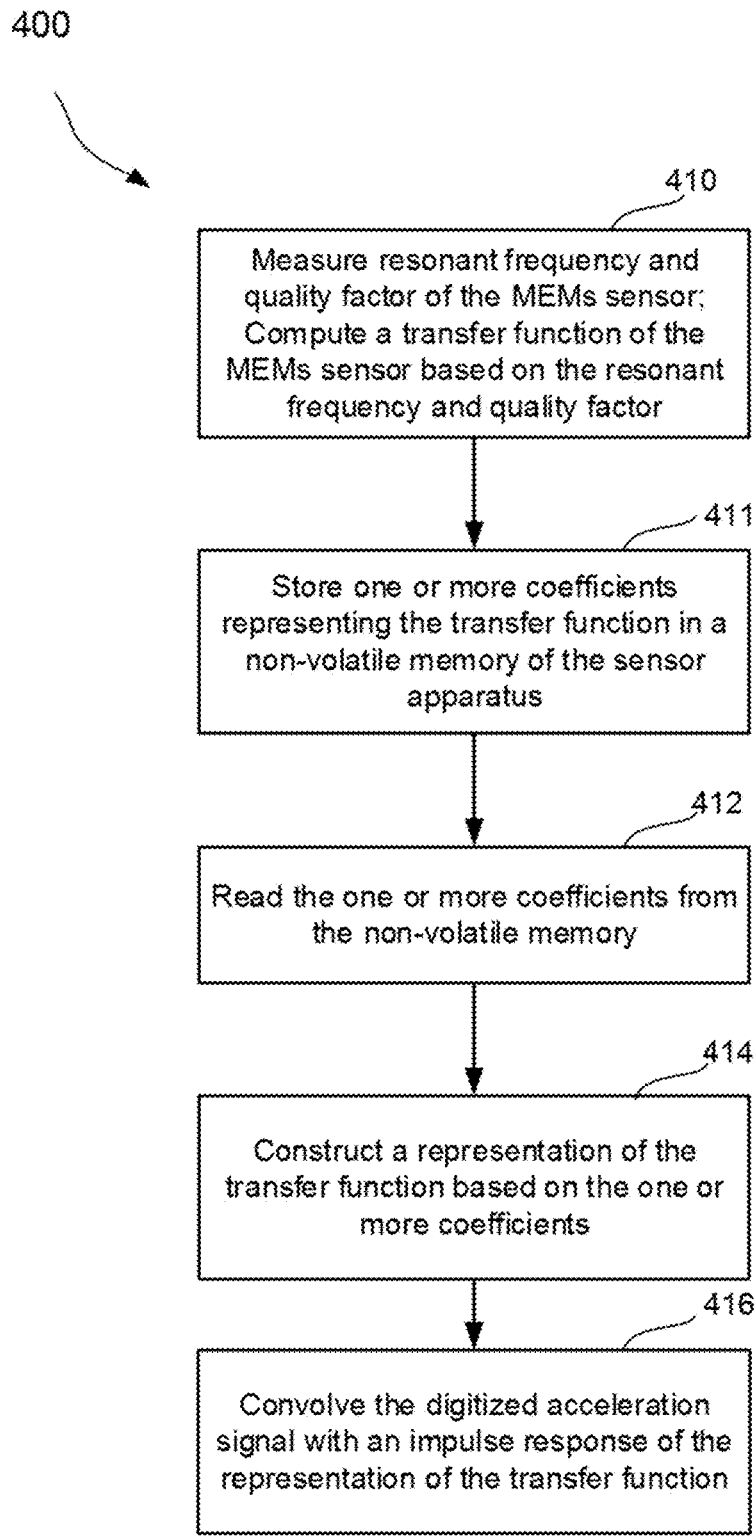
FIG. 4 is a flow diagram of an exemplary process to perform digital equalization with digital equalization filter, in accordance with some embodiments.

FIG. 4 is a flow diagram of an exemplary process 400 to perform digital equalization with digital equalization filter 130, in accordance with some embodiments.

At act 410 of process 400, mechanical characteristics such as resonant frequency $f_0$ and quality factor Q of the MEMs sensor 110 is measured. Measurement of $f_0$ and Q may be carried out as part of manufacturing process, prior to packaging sensor 10 for sale and use by the customer. Alternatively or additionally, $f_0$ and Q may be characterized after manufacturing, for example with a tester when assembling sensor 10 as part of an electronic device. The measured $f_0$ and Q may be stored in sensor 10, for example in at least one non-volatile memory 140 as shown in FIG. 1. It should be appreciated that it is not a requirement that the non-volatile memory 140 stores the raw values of $f_0$ and Q. In the embodiment shown in FIG. 4, act 410 also comprises computing a transfer function of the MEMs sensor based on a pre-determined formula such as Eq. 1 using the measured $f_0$ and Q. The computation may be performed in an external processor such as a computer in the tester that measures $f_0$ and Q, although aspects of the present application is not so limited.

At act 411, coefficients that represent the fitting parameters of the transfer function may be stored in the non-volatile memory. It should be appreciated that the coefficients may also be fitting parameters of a representation of the transfer function, and not the transfer function itself. In some embodiments, an equalization (EQ) curve that is the inverse of the transfer function may be computed, and fitting parameters of the EQ curve may be stored at act 411 as the coefficients. The coefficients may be, for example, quadratic or higher order polynomial curve fitting coefficients.

At act 412, the digital equalization filter 130 reads the one or more stored coefficients from the at least one non-volatile memory 140. Reading of the coefficients may be performed only once during device power up to save power.

At act 414, a representation of the transfer function of the MEMs sensor is constructed based on the one or more stored coefficients in the at least one non-volatile memory 140. For example, the EQ curve may be constructed at this act to represent the transfer function. The construction may be performed using processors within the digital equalization filter 130 using a pre-determined formula.

At act 416, digital equalization filter 130 convolves the digitized acceleration signal 122 with an impulse response of the representation of the transfer function to generate the equalized acceleration signal 132. According to some embodiments, it is not necessary to compute the impulse response of the EQ curve, if it is comprised of several stages in cascade. In such embodiments, the input digitized acceleration signal data sequence is computed as it enters and exits each session of the equalizer.

Aspects of the present application are also directed to using the digital equalization filter to correct temperature compensation of the MEMs sensor. The inventor has recognized and appreciated that mechanical characteristics of the MEMs sensor are susceptible to temperature variations during operation. For example, $f_0$ and Q of the MEMs sensor may drift as a function of temperature. In some embodiments, a temperature sensor 150 may be provided in a sensor, as shown in FIG. 1. The temperature sensor 150 may be disposed adjacent to the accelerator 100 and preferably, adjacent the MEMs sensor 110 to measure the temperature of the movable mass within the accelerometer.

Figure 5:
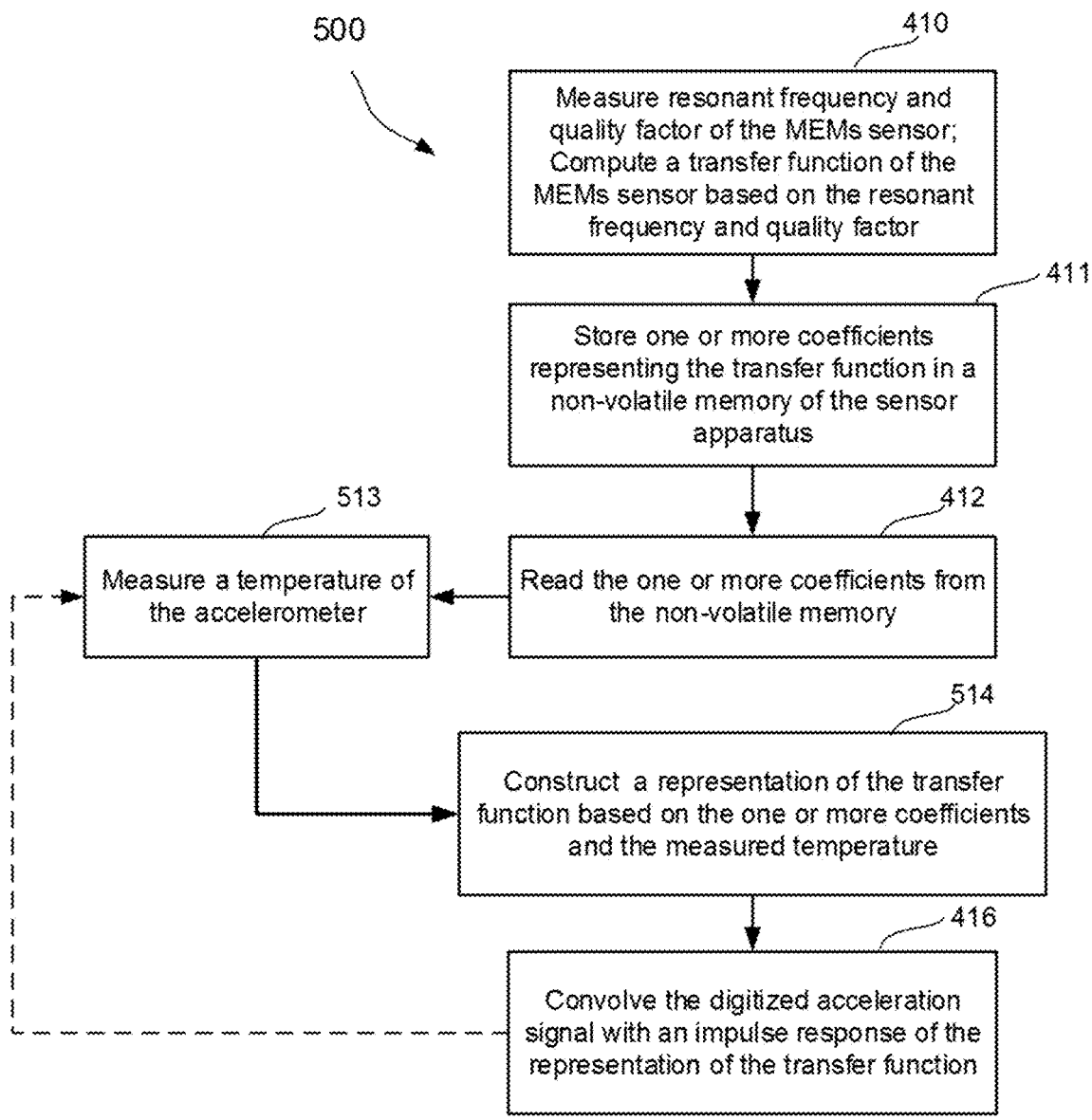
FIG. 5 is a flow diagram of an exemplary process to perform digital equalization of an acceleration signal while providing temperature compensation, in accordance with some embodiments.

FIG. 5 is a flow diagram of an exemplary process 500 to perform digital equalization of an acceleration signal while providing temperature compensation, in accordance with some embodiments. Process 500 is similar in many aspects to process 400 as shown in FIG. 4, with like numerals representing similar acts.

Process 500 differs from process 400 in that after act 412, the process proceeds to act 513, where a temperature of the accelerometer is measured. At act 514, a representation of the transfer function of the MEMs sensor is constructed based not only on the one or more stored coefficients, but also on the measured temperature. A temperature-compensated predictive model of the MEMs sensor may be created in the form of a polynomial fitting formula with coefficients that can provide a compensated $f_0$ and Q based on the measured temperature. Other means for providing temperature compensation may also be used, such as storing a look up table in the non-volatile memory, with entries of the look up table representing pre-calibrated $f_0$ and Q values at each temperature.

At the end of process 500, after the digitized acceleration signal is convolved with an impulse response of the representation of the transfer function at act 416 to generate the equalized acceleration signal, the process may optionally go back to act 513 to take another measurement of temperature. The measured temperature may be stored in a volatile memory, and used in subsequent acts 514 and 416 to provide digital equalization with continuously updated temperature readings. In some embodiments, act 513 may be repeated at a regular interval of time during operation of sensor 10.

Digital equalization filter 130 may be implemented with any suitable digital circuit design known in the art, and may be integrated with circuitry 120 on a same semiconductor substrate. In some embodiments, digital equalization filter may be implemented with a cascade of multiple digital filters. In one embodiment, the digital equalization filter can be implemented by the droop correction filter in a decimation filter since at higher data rate (which is available in a multi-rate decimation filter design), coefficients for the transfer function of the MEMs sensor can be computed more efficiently with smaller word-width.

Referring back to the data chart 20 in FIG. 2. Curve 232 is a simulated frequency response of an equalized acceleration signal such as signal 132 in FIG. 1. Compared to curve 212 representing the frequency response of the non-equalized acceleration signal 112, curve 232 shows that the peaking magnitude around $f_0$=5.8 kHz has been flattened to be close to zero dB. Significantly, curve 232 has an extended frequency range between 0 (or DC) and 8 kHz in which the frequency response is relatively flat with a magnitude variation of no more than 3 dB, and an extended frequency range between 0 and 7 kHz in which the frequency response is relatively flat with a magnitude variation of no more than 1 dB. Therefore the usable frequency range of an accelerator having MEMs sensor of the type as simulated in FIG. 2 can be expanded from 1.5 kHz to 7 kHz or more.

FIG. 2 also shows curves 231, 233, which represent simulated frequency responses of intermediate results of the digital equalization filter. Curve 231 shows the compensation effect of a droop filter, which has flattened response both to the left side and the right side of $f_0$. Curve 233 shows the compensation effect of a notch filter, which has a dip centered around $f_0$. The combination of curves 212, 231 and 233 contribute to the equalized acceleration signal represented by curve 232.

Figure 6:
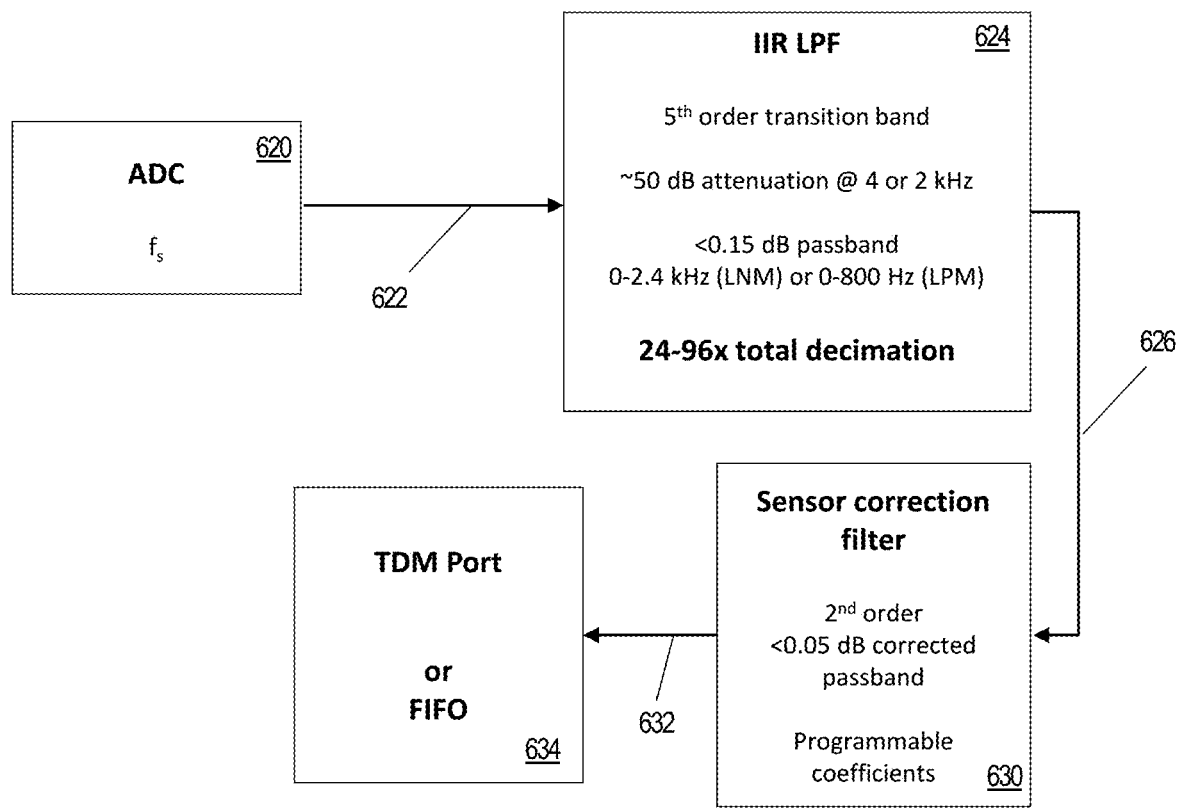
FIG. 6 is a block diagram illustrating components of the circuitry and the digital equalization filter, in accordance with an exemplary embodiment.

FIG. 6 is a block diagram illustrating components of the circuitry and the digital equalization filter, in accordance with an exemplary embodiment. FIG. 6 shows a ADC 620, an Infinite Impulse Response (IIR) low-pass filter (LPF) 624, a sensor correction filter 630 and a time division multiplexing (TDM) port 634.

In FIG. 6, ADC 620 may be part of circuitry 120 as shown in FIG. 1, and generates a digitized acceleration signal 622 at an output that represents a measured analog acceleration signal in an accelerometer such as accelerometer 100. The sampling rate $f_s$ for signal 622 may be 384 or 192 kHz in one non-limiting example.

LPF 624 is a digital filter that may process digitized acceleration signal 622 to reduce the data rate using for example 24-96× decimation. The result is an intermediary digital signal 626. In the example above with $f_s$ for signal 622 being 384 or 192 kHz, intermediary digital signal 626 may have a data rate of 8 kHz or 4 kHz. Filter 624 may also employ a droop filter, which corrects the droop in the frequency response, and contributes to flattening the frequency response around $f_0$ in the digitized acceleration signal 622. Therefore a digital equalization filter in accordance with aspects of the present application may include a digital filter such as LPF 624.

Sensor correction filter 630 may read stored second order coefficients for the resonator transfer function from a non-volatile memory and apply the coefficients to perform filtering on the intermediate digital signal 626 to generate an equalized acceleration signal 632, using methods discussed above, such as process 400 as shown in FIG. 4. The outputted equalized acceleration signal 632 is then passed to TDM port 634 for further processing.

Figure 7:
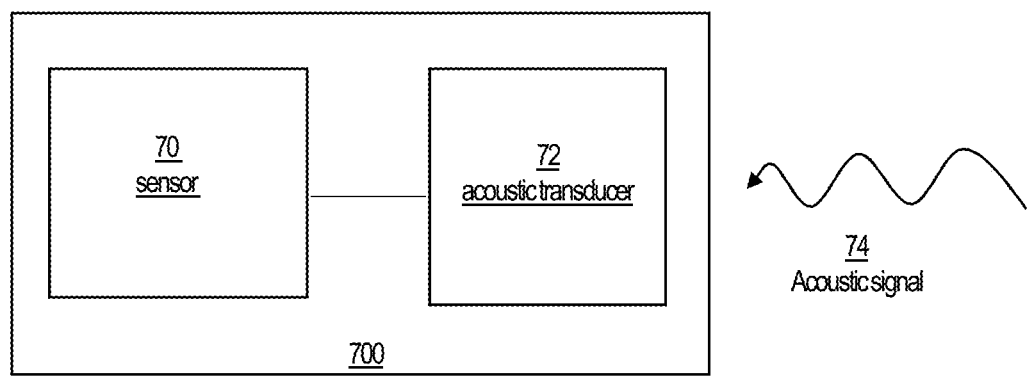
FIG. 7 is a schematic diagram of an electronic device that houses one or more sensor of the type as disclosed in the present application.

FIG. 7 is a schematic diagram of an electronic device 700 that houses one or more sensor 70 of the type as disclosed in the present application. According to an aspect of the present application, a sensor 70 having low-g MEMs accelerator may be provided in a wearable electronic device 700 as shown in FIG. 7 to measure acoustic signals 74, such as human voice, music, or other audio emissions. Sensor 70 may have components similar to sensor 10 that are configured to be operated in a similar fashion with sensor 10 as described above. Wearable electronic device 700 may be an earphone, a headset, or a part of a smartphone. In one example, wearable electronic device 700 may also have an acoustic transducer 72 such as a microphone for directly measuring acoustic signals. Microphone 72 may be turned off to save battery power, with the intention to be reactivated upon detection of a voice. However, in a noisy environment, it may be difficult for traditional microphones or sensors to differentiate the onset of human utterance from the background acoustic emissions. Sensor 70 may be able to detect a low-level acoustic signal using a low-noise MEMs accelerator, and to wake up microphone 72 for continued measurement of the acoustic signal. In such an application, overall battery life of the electronic device 700 may be reduced as there is no need for microphone 72 to be operating continuously.

The technology described herein may be used in various settings, including those in which accelerometers are used. For example, consumer portable electronics, automotive, industrial automation and control, instrumentation and measurements, and healthcare applications may all make use of the technology described herein.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

What is claimed is:

1. A method for operating a sensor apparatus comprising an accelerometer having a microelectromechanical systems (MEMs) sensor with a resonant frequency ($f_0$), the method comprising:
   measuring an acceleration signal at an output of the accelerometer;
   generating a digitized acceleration signal based on the acceleration signal; and
   processing, with a digital equalization filter, the digitized acceleration signal to generate an equalized acceleration signal having a frequency response that is equalized over a frequency range that extends from 0 to $f_0$, wherein:
   the equalized acceleration signal has a magnitude frequency response that varies by no more than 3 decibels in the frequency range.

2. The method of claim 1, wherein the magnitude frequency response varies by no more than 1 decibel in the frequency range.

3. The method of claim 1, wherein processing the digitized acceleration signal comprises:
convolving the digitized acceleration signal with an impulse response of a representation of a transfer function of the MEMs sensor.

4. The method of claim 3, wherein processing the digitized acceleration signal further comprises:
constructing the representation of the transfer function of the MEMs sensor based on one or more coefficients stored in at least one non-volatile memory of the sensor.

5. The method of claim 4, further comprising:
measuring the $f_0$ and a quality factor (Q) of the MEMs sensor;
computing a transfer function of the MEMs sensor based on the measured $f_0$ and Q;
storing one or more coefficients representing the transfer function in the at least one non-volatile memory.

6. The method of claim 4, further comprising measuring a temperature of the accelerometer, and wherein
constructing the representation of the transfer function of the MEMs sensor is based on the one or more coefficients and the measured temperature.

7. The method of claim 1, further comprising
integrating the equalized acceleration signal to generate an output signal representing an acoustic signal received by the accelerometer.

8. The method of claim 1, wherein generating the digitized acceleration signal comprises:
sampling the acceleration signal with an analog-to-digital converter to generate a sampled signal;
processing the sampled signal with a decimation filter; and
generating the digitized acceleration signal based on an output of the decimation filter.

9. A sensor apparatus comprising:
an accelerometer having a microelectromechanical systems (MEMs) sensor with a resonant frequency ($f_0$);
a non-volatile memory configured to store one or more coefficients representing one or more mechanical characteristics of the MEMs sensor;
circuitry configured to:
measure an acceleration signal at an output of the accelerometer;
generate a digitized acceleration signal based on the acceleration signal; and
a digital equalization filter configured to generate an equalized acceleration signal based on the digitized acceleration signal, wherein the equalized acceleration signal has a frequency response that is equalized over a frequency range that extends from 0 to $f_0$, wherein:
the equalized acceleration signal has a magnitude frequency response that varies by no more than 3 decibels in the frequency range.

10. The sensor apparatus of claim 9, wherein
the digital equalization filter is configured to generate an impulse response of a transfer function of the MEMs sensor based on the one or more coefficients, and
to generate the equalized acceleration signal by convolving the digitized acceleration signal with the impulse response.

11. The sensor apparatus of claim 10, wherein the one or more coefficients comprise $f_0$ and a quality factor.

12. The sensor apparatus of claim 10, further comprising a temperature sensor, and wherein:
the digital equalization filter is further configured to construct the transfer function of the resonator based on the one or more coefficients and a temperature of the accelerometer as measured by the temperature sensor.

13. The sensor apparatus of claim 9, further comprising an integrator configured to generate an output signal representing an acoustic signal received by the accelerometer by integrating the equalized acceleration signal.

14. The sensor apparatus of claim 9, wherein the circuitry comprises:
an analog-to-digital converter coupled to the output of the resonator and configured to generate a sampled signal;
a decimation filter coupled to the analog-to-digital converter and configured to generate the digitized acceleration signal at an output of the decimation filter.

15. The sensor apparatus of claim 9, further comprising an integrated circuit, wherein
the circuitry and the digital equalization filter are part of the integrated circuit.

16. A sensor system, comprising:
an accelerometer having an output and a microelectromechanical systems (MEMs) sensor with a resonant frequency ($f_0$);
an integrated circuit configured to:
measure an acceleration signal at the output of the accelerometer;
generate a digitized acceleration signal based on the acceleration signal; and
a digital equalization filter configured to generate an equalized acceleration signal based on the digitized acceleration signal, wherein the equalized acceleration signal has a frequency response that is equalized over a frequency range that extends from 0 to $f_0$, wherein:
the equalized acceleration signal has a magnitude frequency response that varies by no more than 3 decibels in the frequency range.

* * * * *